United States Patent
Kato et al.

(10) Patent No.: US 9,461,228 B2
(45) Date of Patent: Oct. 4, 2016

(54) THERMOELECTRIC CONVERSION MATERIAL AND METHOD FOR MANUFACTURING SAME

(71) Applicants: LINTEC CORPORATION, Itabashi-ku (JP); KYUSHU INSTITUTE OF TECHNOLOGY, Kitakyushu-shi (JP)

(72) Inventors: Kunihisa Kato, Itabashi-ku (JP); Tsuyoshi Mutou, Itabashi-ku (JP); Koji Miyazaki, Kitakyushu (JP)

(73) Assignees: LINTEC CORPORATION, Itabashi-ku (JP); KYUSHU INSTITUTE OF TECHNOLOGY, Kitakyushu-shi (JP)

( * ) Notice: Subject to any disclaimer, the term of this patent is extended or adjusted under 35 U.S.C. 154(b) by 80 days.

(21) Appl. No.: 14/385,595

(22) PCT Filed: Mar. 11, 2013

(86) PCT No.: PCT/JP2013/056691
§ 371 (c)(1),
(2) Date: Sep. 16, 2014

(87) PCT Pub. No.: WO2013/141065
PCT Pub. Date: Sep. 26, 2013

(65) Prior Publication Data
US 2015/0048283 A1    Feb. 19, 2015

(30) Foreign Application Priority Data
Mar. 21, 2012    (JP) ................. 2012-064245

(51) Int. Cl.
*H01L 35/16* (2006.01)
*H01L 35/24* (2006.01)
*H01L 35/34* (2006.01)

(52) U.S. Cl.
CPC ............. *H01L 35/24* (2013.01); *H01L 35/16* (2013.01); *H01L 35/34* (2013.01)

(58) Field of Classification Search
CPC ........ H01L 35/24; H01L 35/16; H01L 27/16
See application file for complete search history.

(56) References Cited

U.S. PATENT DOCUMENTS

2003/0032709 A1 *  2/2003  Toshima ............... C08K 3/08
                                                    524/439

FOREIGN PATENT DOCUMENTS

| CN | 101273474 A | | 9/2008 |
| JP | 2003-46145 | * | 2/2003 |
| JP | 2003-046145 A | | 2/2003 |
| JP | 2006-040963 A | | 2/2006 |
| JP | 2010-199276 A | | 9/2010 |
| JP | 2012-9462 | * | 1/2012 |
| JP | 2012-009462 A | | 1/2012 |

OTHER PUBLICATIONS

Kato et al, "Fabrication of Bismuth Telluride Thermoelectric Film Containing Conductive Polymers Using a Prinating Metyhod", Jorn. Electronic Materials, vol. 42, No. 7, Feb. 14, 2013; pp. 1313-1318.*
Extended European Search Report issued Oct. 15, 2015 in Patent Application No. 13765181.6.
Kunihisa Kato, et al., "Fabrication of Bismuth Telluride Thermoelectric Films Containing Conductive Polymers Using a Printing Method" Journal of Electronic Materials, vol. 42, No. 7, XP055217007, 2013, pp. 1313-1318.
U.S. Appl. No. 14/396,527, filed Oct. 23, 2014, Kato, et al.
U.S. Appl. No. 14/428,141, filed Mar. 13, 2015, Kato, et al.
International Search Report issued Apr. 23, 2013 in PCT/JP2013/056691 filed Mar. 11, 2013.
Deepa Madan, et al., "Dispenser printed composite thermoelectric thick films for thermoelectric generator applications" Journal of Applied Physics, vol. 109, 2011, pp. 034904-1-034904-6.
Combined Chinese Office Action and Search Report issued Apr. 6, 2016 in Patent Application No. 201380015224.3 (with English translation of Categories of Cited Documents).

* cited by examiner

*Primary Examiner* — Carol M Koslow
(74) *Attorney, Agent, or Firm* — Oblon, McClelland, Maier & Neustadt, L.L.P (57) ABSTRACT

The present invention provides a thermoelectric conversion material excellent in thermoelectric performance and flexibility and capable of being produced in a simplified manner and at a low cost, and a method for producing the material. The thermoelectric conversion material has, on a support, a thin film of a thermoelectric semiconductor composition containing thermoelectric semiconductor fine particles and a conductive polymer, and the method for producing a thermoelectric conversion material includes a step of applying the thermoelectric semiconductor composition containing thermoelectric semiconductor fine particles and a conductive polymer onto the support and drying it to form a thin film thereon.

20 Claims, 1 Drawing Sheet

THERMOELECTRIC CONVERSION MATERIAL AND METHOD FOR MANUFACTURING SAME

TECHNICAL FIELD

The present invention relates to a thermoelectric conversion material that carries out energy interconversion between heat and electricity, and especially relates to a thermoelectric conversion material that uses a thermoelectric semiconductor composition containing a particulated thermoelectric semiconductor and a conductive polymer and has an improved figure of merit, and to its production method.

BACKGROUND ART

Recently, a thermoelectric power-generating technology for which the system is simple and can be down-sized has been specifically noted as a power recovery technology for unharnessed exhaust heat energy that is generated from fossil fuel resources and others used in buildings, factories, etc. However, thermoelectric power generation is, in general, poorly efficient in power generation, and therefore, studies and developments are being actively made for improving power generation efficiency in various companies and research institutes. For improving power generation efficiency, it is indispensable to enhance the efficiency of thermoelectric conversion materials, and for realizing it, it is desired to develop materials having a high electrical conductivity comparable to that of metals and having a low thermal conductivity comparable to that of glass.

A thermoelectric conversion characteristic can be evaluated by a figure of merit Z ($Z=\sigma S^2/\lambda$). Here, S means a Seebeck coefficient, $\sigma$ means an electrical conductivity (reciprocal of resistivity), and $\lambda$ means a thermal conductivity. Increasing the value of the figure of merit Z improves the power generation efficiency, and for enhancing the efficiency in power generation, it is important to find out a thermoelectric conversion material having a large Seebeck coefficient and a large electrical conductivity $\sigma$, and having a small thermal conductivity $\lambda$.

As described above, investigations for improving power generation efficiency are needed while, on the other hand, thermoelectric conversion devices that are now produced are poor in mass-productivity and the power generation units therein are expensive. Consequently, for further disseminating the devices in use in large areas, for example, in installation thereof on the wall surface of buildings, production cost reduction is imperative. In addition, thermoelectric conversion devices that are produced at present are poorly flexible, and therefore flexible thermoelectric conversion devices are desired.

Given the situation, PTL 1 discloses, for the purpose of improving power generation efficiency and for efficient production, a method for producing a thermoelectric conversion device that comprises a step of applying a solution to be a material of a p-type or n-type organic semiconductor material, onto a support having patterned insulator layer to the surface thereof by coating or printing thereon followed by drying it. However, the method requires patterning that includes alignments to be repeated plural times, such as screen printing or the like, and therefore the step is complicated and, as a result, the takt time is long, therefore providing a problem of rising costs.

On the other hand, in NPL 1, an investigation is made, using a composition prepared by dispersing, as a thermoelectric conversion material, bismuth telluride in an epoxy resin as a binder, and forming the composition into a film by coating, thereby producing a thin-film thermoelectric conversion device. However, this requires a sintering process at a high temperature not lower than the decomposition temperature of the binder resin, and therefore still has a problem in that the flexibility of the produced film could be on the same level as that in the case of forming a film of bismuth telluride alone.

CITATION LIST

Patent Literature

PTL 1: JP-A 2010-199276

Non-Patent Literature

NPL 1: D. Madan, Journal of Applied Physics 2011, 109, 034904.

SUMMARY OF INVENTION

Technical Problem

In consideration of the above-mentioned situation, an object of the present invention is to provide a thermoelectric conversion material excellent in thermoelectric performance and flexibility and can be produced in a simplified manner and at a low cost, and to provide a method for producing the material.

Solution to Problem

The present inventors have assiduously made repeated studies for solving the above-mentioned problems and, as a result, have found that, when a thin film of a thermoelectric semiconductor composition that contains a particulated thermoelectric semiconductor capable of contributing toward thermal conductivity reduction and a conductive polymer capable of preventing electrical conductivity reduction in the spaces between the fine particles, is formed on a support, then a thermoelectric conversion material having a higher figure of merit than that of the above-mentioned existing thermoelectric conversion materials can be obtained, and have completed the present invention.

Specifically, the present invention provides the following (1) to (12):

(1) A thermoelectric conversion material having, on a support, a thin film of a thermoelectric semiconductor composition containing thermoelectric semiconductor fine particles and a conductive polymer.

(2) The thermoelectric conversion material according to the above (1), wherein the blending amount of the thermoelectric semiconductor fine particles is from 30 to 99% by mass in the thermoelectric semiconductor composition.

(3) The thermoelectric conversion material according to the above (1) or (2), wherein the mean particle size of the thermoelectric semiconductor fine particles is from 10 nm to 200 µm.

(4) The thermoelectric conversion material according to any of the above (1) to (3), wherein the thermoelectric semiconductor fine particles are bismuth-tellurium-based thermoelectric semiconductor fine particles.

(5) The thermoelectric conversion material according to any of the above (1) to (4), wherein the conductive polymer is a polythiophene or a derivative thereof.

(6) The thermoelectric conversion material according to any of the above (1) to (5), wherein the thermoelectric semiconductor composition further contains a water-soluble polymer.

(7) The thermoelectric conversion material according to the above (6), wherein the water-soluble polymer is a water-soluble polyvinyl polymer.

(8) The thermoelectric conversion material according to any of the above (1) to (7), wherein the thermoelectric semiconductor composition further contains an organic compound having a boiling point of 100° C. or higher.

(9) The thermoelectric conversion material according to the above (8), wherein the organic compound is a polyalcohol.

(10) A method for producing a thermoelectric conversion material having, on a support, a thin film of a thermoelectric semiconductor composition containing thermoelectric semiconductor fine particles and a conductive polymer, which includes a step of applying the thermoelectric semiconductor composition containing thermoelectric semiconductor fine particles and a conductive polymer onto the support and drying it to form a coating film thereon.

(11) The method for producing a thermoelectric conversion material according to the above (10), wherein the thermoelectric semiconductor fine particles are annealed ones.

(12) The method for producing a thermoelectric conversion material according to the above (11), wherein the annealing treatment is carried out in a temperature range not higher than the melting point of the thermoelectric semiconductor fine particles.

Advantageous Effects of Invention

According to the present invention, there is provided a thermoelectric conversion material capable of being produced in a simplified manner and at a low cost and excellent in thermoelectric performance and flexibility.

DESCRIPTION OF EMBODIMENTS

[Thermoelectric Conversion Material]
The thermoelectric conversion material of the present invention is characterized by having, on a support, a thin film of a thermoelectric semiconductor composition containing thermoelectric semiconductor fine particles and a conductive polymer.
(Support)
Not specifically defined, the support for use in the thermoelectric conversion material of the present invention may be any one not having any influence on lowering the electrical conductivity of the thermoelectric conversion material and on increasing the thermal conductivity thereof. The support includes, for example, glass, silicon, plastic substrates, etc.
(Thermoelectric Semiconductor Fine Particles)
The thermoelectric semiconductor fine particles for use in the thermoelectric conversion material of the present invention may be prepared by grinding a thermoelectric semiconductor material into a predetermined size, using a fine grinding mill or the like.

The thermoelectric semiconductor material may be any material capable of generating a thermoelectromotive force when given a temperature difference applied thereto, and includes, for example, a bismuth-tellurium-based thermoelectric semiconductor material such as a p-type bismuth telluride, an n-type bismuth telluride, $Bi_2Te_3$, etc.; a telluride-based thermoelectric semiconductor material such as GeTe, PbTe, etc.; an antimony-telluride-based thermoelectric semiconductor material; a zinc-antimony-based thermoelectric semiconductor material such as ZnSb, $Zn_3Sb_2$, $Zn_4Sb_3$, etc.; a silicon-germanium-based thermoelectric semiconductor material such as SiGe, etc.; a bismuth-selenide-based thermoelectric semiconductor material such as $Bi_2Se_3$, etc., a silicide-based thermoelectric semiconductor material such as $\beta$-$FeSi_2$, $CrSi_2$, $MnSi_{1.73}$, $Mg_2Si$, etc.; an oxide-based thermoelectric semiconductor material; a Heusler material such as FeVAl, FeVAlSi, FeVTiAl, etc.

Of those, for the thermoelectric semiconductor material for use in the present invention, preferred is a bismuth-tellurium-based thermoelectric semiconductor material such as a p-type bismuth telluride, an n-type bismuth telluride, $Bi_2Te_3$, etc.

The carrier of the p-type bismuth telluride is a hole and the Seebeck coefficient thereof is positive, for which, for example, preferably used is one represented by $Bi_XTe_3Sb_{2-X}$. In this case X is preferably $0<X\leq0.6$, more preferably $0.4<X\leq0.6$. X of more than 0 and 0.6 or less is preferred since the Seebeck coefficient and the electrical conductivity of the material are large and the material can maintain the characteristics of p-type thermoelectric conversion material.

The carrier of the n-type bismuth telluride is an electron and the Seebeck coefficient thereof is negative, for which, for example, preferably used is one represented by $Bi_2Te_{3-Y}Se_Y$. In this case Y is preferably $0<X\leq3$, more preferably $0.1<X\leq2.7$. Y of more than 0 and 3 or less is preferred since the Seebeck coefficient and the electrical conductivity of the material are large and the material can maintain the characteristics of n-type thermoelectric conversion material.

The blending amount of the thermoelectric semiconductor fine particles in the thermoelectric semiconductor composition for use in the present invention is preferably from 30 to 99% by mass. The amount is more preferably from 50 to 96% by mass, particularly preferably from 70 to 95% by mass. The blending amount of the thermoelectric semiconductor fine particles falling within the above range is preferred since the absolute value of the Seebeck coefficient is large and since the electrical conductivity reduction can be prevented and only the thermal conductivity is lowered, and therefore the material exhibits high-level thermoelectric performance and can form a film having a sufficient film strength and flexibility.

The mean particle size of the thermoelectric semiconductor fine particles for use in the present invention is preferably from 10 nm to 200 μm, more preferably from 10 nm to 30 μm, even more preferably from 50 nm to 5 μm. The particles falling within the above range are preferred as capable of being uniformly dispersed with ease and capable of reducing the thermal conductivity of the material not lowering the electrical conductivity thereof.

The method of producing the thermoelectric semiconductor fine particles by finely grinding the thermoelectric semiconductor material is not specifically defined, and the material may be ground into a predetermined size, using a known fine grinding mill or the like, such as a jet mill, a ball mill, a bead mill, a colloid mill, a conical mill, a disc mill, an edge mill, a powdering mill, a hammer mill, a pellet mill, a whirly mill, a roller mill, etc.

The mean particle size of the thermoelectric semiconductor fine particles may be measured with a laser diffraction particle sizer (CILAS's 1064 Model), and the median value of the particle size distribution is taken as the mean particle size.

(Conductive Polymer)

The conductive polymer in the present invention is used for filling up the spaces between the above-mentioned thermoelectric semiconductor fine particles to thereby prevent the electrical conductivity of the material from lowering and for making the thermoelectric conversion material flexible.

Not specifically defined, the conductive polymer may be any one having film formability and exhibiting conductivity, for which, for example, usable here is at least one selected from polyacetylene, polyphenylene sulfide, poly(1,6-heptadiyne), polybiphenylene(polyparaphenylene), polyparaphenylene sulfide, polyphenylacetylene and poly(2,5-thienylene) that exhibit conductivity owing to the πelectron-conjugated system therein, and further polythiophenes, polyanilines and polypyrroles and their derivatives, and mixtures of two or more of them.

Polythiophenes are polymers of thiophene, including, for example, polymers such as poly-3-methylthiophene, poly-3-ethylthiophene, poly-3-methoxythiophene, poly-3-ethoxythiophene, poly(3,4-ethylenedioxythiophene) (PEDOT), etc.

As derivatives of polythiophenes, there are mentioned those prepared by doping or mixing the above-mentioned polythiophenes with a dopant. The dopant includes halide ions, perchlorate ions, tetrafluoroborate ions, hexafluoroarsenate ions, sulfate ions, nitrate ions, thiocyanate ions, hexafluorosilicate ions, phosphate ions, trifluoroacetate ions, alkylbenzenesulfonate ions, alkylsulfonates ions, polymer ions such as polyacrylate ions, polyvinylsulfonate ions, polystyrenesulfonate ions (PSS), poly(2-acrylamide-2-methylpropanesulfonate) ions, etc.; and one alone or two or more of these may be used here either singly or as combined.

Of those, as derivatives of polythiophenes, especially preferred is a mixture of poly(3,4-ethylenedioxythiophene) (PEDOT) and polystyrenesulfonate ion (PSS) (PEDOT:PSS), from the viewpoint of the ability thereof to provide high conductivity.

Polyanilines are polymers of aniline, including, for example, poly-2-methylaniline, poly-3-methylaniline, poly-2-ethylaniline, poly-3-ethylaniline, poly-2-methoxyaniline, poly-3-methoxyaniline, poly-2-ethoxyaniline, poly-3-ethoxyaniline, poly-N-methylaniline, poly-N-propylaniline, poly-N-phenyl-1-naphthylaniline, poly-8-anilino-1-naphthalenesulfonic acid, poly-2-aminobenzenesulfonic acid, poly-7-anilino-4-hydroxy-2-naphthalenesulfonic acid, etc.

Derivatives of polyanilines include those prepared by doping or mixing the above-mentioned polyanilines with a dopant. As the dopant, usable are those exemplified hereinabove for the dopant for thiophene derivatives. One alone or two or more different types of these may be used here either singly or as combined.

Of those, preferred are polymer ions such as polyacrylate ions, polyvinylsulfonate ions, polystyrenesulfonate ions (PSS), poly(2-acrylamide-2-methylpropanesulfonate) ions, etc., from the viewpoint of the ability thereof to provide high conductivity; and more preferred are polystyrenesulfonate ions (PSS) as providing water-soluble and strongly acidic polymers.

Polypyrroles are polymers of pyrrole, and include, for example, poly-1-methylpyrrole, poly-3-methylpyrrole, poly-1-ethylpyrrole, poly-3-ethylpyrrole, poly-1-methoxypyrrole, 3-methoxypyrrole, poly-1-ethoxypyrrole, poly-3-ethoxypyrrole, etc.

Derivatives of polypyrroles include those prepared by doping or mixing the above-mentioned polypyrroles with a dopant. As the dopant, usable are those exemplified hereinabove for the dopant for thiophene derivatives.

Of those, as the conductive polymers, preferred is at least one selected from polythiophenes, polyanilines, polypyrroles and derivatives thereof, or a mixture of two or more of them, from the viewpoint of the electrical conductivity; and more preferred are polythiophenes or derivatives thereof.

The blending amount of the conductive polymer in the thermoelectric semiconductor composition is preferably from 1 to 70% by mass, more preferably from 4 to 50% by mass, even more preferably from 5 to 30% by mass. The blending amount of the conductive polymer falling within the above range provides a film satisfying both good thermoelectric performance and film strength.

(Other Components)

The thermoelectric semiconductor composition comprising thermal semiconductor fine particles and a conductive polymer for use in the present invention may further contain any other component, for example, any other polymer component than the conductive polymer, an organic compound having a boiling point not lower than 100° C., etc.

The polymer component is for sticking a thin film of the thermoelectric semiconductor composition comprising thermal semiconductor fine particles and a conductive polymer to a support and for increasing the film strength of the thin film.

Consequently, it is desirable that the thermoelectric semiconductor composition for use in the present invention further contains such other polymer component than the conductive polymer.

Not specifically defined, the polymer component may be any one having the ability to uniformly disperse the thermal semiconductor fine particles and the conductive polymer to provide the film strength not lowering the thermoelectric performance of the film. From the viewpoint of the dispersibility, preferred is a water-soluble polymer.

The water-soluble polymer includes, for example, water-soluble polyvinyl polymers; polyalkylene glycols such as polyethylene glycol, polypropylene glycol, etc.; cellulose derivatives such as hydroxyethyl cellulose, carboxymethyl cellulose, etc.; polyacrylamides, etc. Of those, preferred are water-soluble polyvinyl polymers from the viewpoint of the thermoelectric performance and the film strength. One alone or two or more different types of these may be used here either singly or as combined.

The water-soluble polyvinyl polymers include acrylic acid polymers such as polyacrylic acid, polymethacrylic acid, etc.; polyvinyl alcohol; polyvinyl alcohol copolymers such as vinyl alcohol/vinyl phthalate copolymer, vinyl acetate/vinyl alcohol/vinyl phthalate copolymer, vinyl alcohol/ethylene copolymer, vinyl alcohol/vinyl acetate copolymer, etc.; polyvinylpyridine; polyvinylpyrrolidone, etc. One alone or two or more different types of these may be used here either singly or as combined.

The blending amount of the polymer component in the thermoelectric semiconductor composition is preferably from 0 to 40% by mass, more preferably from 0 to 20% by mass, particularly preferably from 1 to 20% by mass. The blending amount of the polymer component falling within the above range provides a film satisfying both good thermoelectric performance and film strength.

The organic compound having a boiling point not lower than 100° C. is added for the purpose of improving the conductivity of the conductive polymer and for the purpose of improving the thermoelectric performance of the composition. The organic compound having a boiling point not lower than 100° C. is preferred since, when used in a thermal conversion material, the compound does neither evaporate nor scatter in ordinary use environments and operation environments, and therefore can provide the effect of improving the thermoelectric performance of the material. The organic compound includes polyalcohols, water-soluble pyrrolidones, hydrophilic aprotic compounds.

The polyalcohols include, for example, glycerin, sorbitol, maltitol, diglycerin, ethylene glycol, diethylene glycol, propylene glycol, dipropylene glycol, 1,3-butanediol, 1,4-butanediol, erythritol, sorbitan, glucose, polyethylene glycol, 1,2-butyleneglycol, 1,3-butyleneglycol, 2,3-butylene glycol, 3-methyl-1,3-butylene glycol, tetramethylene glycol, 1,2-pentanediol, 1,2-hexanediol, trimethylolpropane, pentaerythritol, xylitol, trehalose, mannitol. One or more of these may be used here.

The water-soluble pyrrolidones include N-methylpyrrolidone, N-ethylpyrrolidone, N-propylpyrrolidone, N-isopropylpyrrolidone, N-butylpyrrolidone, N-t-butylpyrrolidone, N-pentylpyrrolidone, N-hexylpyrrolidone, N-heptylpyrrolidone, N-cyclohexylpyrrolidone, N-octylpyrrolidone, N-(2-ethylhexyl)pyrrolidone, N-phenylpyrrolidone, N-benzylpyrrolidone, phenethylpyrrolidone, 2-methoxyethylpyrrolidone, 2-methoxypropylpyrrolidone, 2-hydroxypropylpyrrolidone, vinylpyrrolidone, 2-pyrrolidone, etc. One or more of these may be used here.

Further, the hydrophilic aprotic compounds include dimethyl sulfoxide (DMSO), N, N-dimethylformamide (DMF). Adding the organic compound to the thermoelectric semiconductor composition improves the thermoelectric performance of the resultant thin film.

The blending amount of the organic compound in the thermoelectric semiconductor composition is preferably from 0 to 40% by mass, more preferably from 1 to 20% by mass. The blending amount of the organic compound falling within the above range provides a film having high thermoelectric performance.

If desired, the thermoelectric semiconductor composition comprising thermal semiconductor fine particles and a conductive polymer for use in the present invention may further contain any other additives such as dispersant, film formation assistant, light stabilizer, antioxidant, tackifier, plasticizer, colorant, resin stabilizer, filler, pigment, conductive promoter, etc. One alone or two or more of these additives may be used here either singly or as combined.

The method for preparing the thermoelectric semiconductor composition for use in the present invention is not specifically defined. The thermoelectric semiconductor composition may be prepared by mixing and dispersing the above-mentioned thermoelectric semiconductor fine particles and the above-mentioned conductive polymer optionally along with any other components and additives and also with a solvent added thereto, according to a known method using an ultrasonic homogenizer, a spiral mixer, a planetary mixer, a disperser, a hybrid mixer or the like.

The solvent includes, for example, water, toluene, ethyl acetate, methyl ethyl ketone, alcohol, tetrahydrofuran, etc. One alone or two or more different types of these solvents may be used here either singly or as combined. The solid concentration of the thermoelectric semiconductor composition is not specifically defined so far as the composition may have a viscosity suitable for coating operation.

A thin film of the thermoelectric semiconductor composition may be formed by applying the thermoelectric semiconductor composition onto a support and drying it thereon, as described for the production method for the thermoelectric conversion material of the present invention to be given hereinunder. According to the formation method, a large-area thermoelectric conversion material can be produced in a simplified manner at a low cost.

The thickness of the thin film of the thermoelectric semiconductor composition is not specifically defined, but is, from the viewpoint of the thermoelectric performance and the film strength, preferably from 10 nm to 50 μm, more preferably from 50 nm to 20 μm.

The thermoelectric conversion material of the present invention may be used singly, but for example, plural pairs of the thermoelectric conversion materials may be used as electrically connected in series to each other via an electrode or as thermally connected in parallel to each other via an insulating material such as ceramics or the like, and can be used as a thermoelectric conversion device for power generation or for cooling.

[Method for Producing Thermoelectric Conversion Material]

The method for producing a thermoelectric conversion material of the present invention is a method for producing a thermoelectric conversion material having, on a support, a thin film of a thermoelectric semiconductor composition containing thermoelectric semiconductor fine particles and a conductive polymer, and includes a step of applying the thermoelectric semiconductor composition containing thermoelectric semiconductor fine particles and a conductive polymer onto the support and drying it to form a thin film thereon (hereinafter this may be referred to as a thin film formation step). The steps that the present invention includes are described in series hereinunder.

In the present invention, the thermoelectric semiconductor fine particles are preferably annealed ones. Concretely, prior to preparation of the thermoelectric semiconductor composition, the thermoelectric semiconductor fine particles may be annealed. The annealing increases the crystallinity of the thermoelectric semiconductor fine particles and increases the Seebeck coefficient of the thermoelectric conversion material, therefore further improving the figure of merit thereof. The annealing treatment is generally carried out in a temperature range not higher than the melting point of the thermoelectric semiconductor fine particles.

More concretely, the annealing treatment temperature preferably falls within a temperature range not higher than the melting point of the thermoelectric semiconductor fine particles and not lower than 20% of the melting point. The annealing treatment method is not specifically defined. Preferably, the annealing treatment is carried out generally in an inert gas atmosphere of nitrogen, argon or the like, or in a reducing gas atmosphere or in vacuum, so as not to have any negative influence on the thermoelectric semiconductor fine particles.

Concretely, the annealing treatment is, in case where a bismuth-tellurium-based thermoelectric semiconductor material is used for the thermoelectric semiconductor fine particles, generally at from 100 to 500° C. and for a few minutes to several tens hours.

(Thin Film Formation Step)

The support for use in the present invention is, as described above, glass, silicon, plastics, etc.

The method of applying the thermoelectric semiconductor composition of the present invention onto the support is not specifically defined, for which employable is any known method of screen printing, flexographic printing, gravure printing, spin coating, dip coating, die coating, spray coating, bar coating, doctor blade coating or the like. In case where a patterned coating film is formed, preferably used is screen printing, die coating or the like.

Next, the resultant coating film is dried to give a thin film. As the drying method, employable is any known drying method of hot air drying, hot roll drying, IR radiation, etc. The heating temperature is generally from 80 to 150° C., and the heating time is generally from several tens seconds to several tens minutes though varying depending on the heating method.

In case where a solvent is used in preparing the thermoelectric semiconductor composition, the heating temperature is not specifically defined so far as it falls within a temperature range capable of removing the used solvent through vaporization, but is preferably so set as to fall within a temperature range not having any negative influence on the other substances constituting the composition.

After the thin film formation, the resulting thermoelectric conversion material may be further annealed.

The annealing stabilizes and further improves the thermoelectric performance. The annealing treatment method is not specifically defined. Like that for the fine particles of the thermoelectric semiconductor material mentioned above, it is desirable that the annealing treatment is carried out generally in an inert gas atmosphere of nitrogen, argon or the like, or in a reducing gas atmosphere or in vacuum, and within a temperature range not having any negative influence on the support and on the conductive polymer, the other polymer component, the organic compound and others constituting the composition.

For example, in case where a glass substrate is used as the support, a mixture of poly(3,4-ethyleneoxide thiophene) (PEDOT) and polystyrenesulfonic acid (PSS) (PEDOT:PSS) is used as the conductive polymer, polyacrylic acid is used as the water-soluble polymer, and glycerin is used as the organic compound having a boiling point not lower than 100° C., the annealing treatment temperature is from 100 to 200° C., and the annealing treatment time is from 5 minutes to 5 hours.

According to the production method of the present invention, there is provided a low-cost thermoelectric conversion material having a high thermoelectric performance, in a simplified manner.

EXAMPLES

Next, the present invention is described in more detail by reference to the Examples, but it should be construed that the present invention is not limited to these Examples at all.

The thermoelectric performance and the flexibility of the thermoelectric conversion materials produced in Examples and Comparative Examples were evaluated according to the methods mentioned below, in which the thermal conductivity, the Seebeck coefficient and the electrical conductivity of each material were calculated.

<Thermoelectric Performance Evaluation>

(a) Thermal Conductivity

In the thermal conductivity measurement, the thermal conductivity ($\lambda$) was calculated according to $3\omega$ method.

(b) Seebeck Coefficient

According to JIS C 2527:1994, the thermoelectromotive force of the thermoelectric conversion material produced in Examples and Comparative Examples was measured, and the Seebeck coefficient was calculated. One end of the thermal conversion material produced was heated, and the resulting temperature difference between both ends of the thermal conversion material was measured using a chromel-alumel thermocouple, and from the electrode adjacent to the thermocouple installation position, the thermoelectromotive force was measured.

Concretely, the distance between both ends of the sample of which the temperature difference and the electromotive force are to be measured was to be 25 mm, one end was kept at 20° C., and the other end was heated from 25° C. to 50° C. at intervals of 1° C. whereupon the thermoelectromotive force was measured and the Seebeck coefficient (S) was calculated from the inclination. The thermocouple installation position and the electrode installation position are symmetric to each other relative to the centerline of the thin film, and the distance between the thermocouple and the electrode is 1 mm.

(c) Electrical Conductivity

Using a surface resistivity meter (Mitsubishi Chemical's trade name: Loresta GP MCP-T600) and according to a four-terminal method, the surface resistivity of each sample of the thermoelectric conversion materials produced in Examples and Comparative Examples was measured, and the electrical conductivity ($\sigma$) thereof was calculated.

From the found data of the Seebeck coefficient, the electrical conductivity and the thermal conductivity, the figure of merit Z ($Z=\sigma S^2/\lambda$) was obtained, and the non-dimensional figure of merit ZT (T=300K) was calculated.

<Flexibility Evaluation>

The thermoelectric conversion materials produced in Examples and Comparative Examples were tested for the thin film flexibility around a mandrel diameter $\phi$ 10 mm, according to a cylindrical mandrel method. Before and after the cylindrical mandrel test, the samples were tested for the thermoelectric performance, and the flexibility of the thermoelectric conversion materials was thereby evaluated.

(Production Method for Thermoelectric Semiconductor Fine Particles)

(Bismuth-Telluride-Based Thermoelectric Semiconductor Material)

Using an ultra-fine grinder (Aishin Nanotechnologies' NanoJetmizer NJ-50-B Model), a p-type bismuth telluride $Bi_{0.4}Te_3Sb_{1.6}$ (by Kojundo Chemical Laboratory, particle size: 180 μm) of a bismuth-tellurium-based thermoelectric semiconductor material was ground in a nitrogen gas atmosphere to give four types of thermoelectric semiconductor fine particles T1 to T4 each having a different particle size. The resultant ground thermoelectric semiconductor fine particles were analyzed for particle size distribution, using a laser diffraction particle sizer (CILAS's 1064 Model).

The mean particle size of the resultant fine particles of the bismuth-tellurium-based thermoelectric semiconductor material was 660 nm (T1), 2.8 μm (T2), 5.5 μm (T3) and 180 μm (T4), respectively.

(Bismuth-Selenide-Based Thermoelectric Semiconductor Material)

In the same manner as above, $Bi_2Se_3$ (by Kojundo Chemical Laboratory, particle size: 80 μm) of a bismuth-selenidebased thermoelectric semiconductor material was ground to give two types of thermoelectric semiconductor fine particles T5 and T6 each having a different particle size. The mean particle size of the resultant bismuth-selenide-based thermoelectric semiconductor material was 0.88 μm (T5) and 20 μm (T6), respectively.

Example 1

(1) Annealing Step for Thermoelectric Semiconductor Fine Particles

The fine particles of p-type bismuth telluride $Bi_{0.4}Te_3Sb_{1.6}$ (T1: particle size 660 nm) were annealed in a hydrogen-argon mixed gas atmosphere at a temperature of 250° C. for 1 hour to give fine particles of p-type bismuth telluride (S1). The annealed thermoelectric semiconductor fine particles were analyzed for particle size distribution using the above-mentioned laser diffraction particle sizer. The mean particle size of the fine particles (S1) was 2.4 μm.

(2) Production of Thermoelectric Semiconductor Composition

The annealed thermoelectric semiconductor fine particles (S1) obtained in (1), a mixture of poly(3,4-ethyleneoxide-thiophene) (PEDOT) and polystyrenesulfonic acid (PSS) (PEDOT:PSS) (Japan Agfa Materials' trade name; S305, solid content 1% by mass) as a conductive polymer, an acrylic acid polymer (Sigma Aldrich trade name: Polyacrylic Acid, weight-average molecular weight 100,000, solid content: 40% by mass) as a binder, and glycerin (by Sigma Aldrich) as an organic compound having a boiling point not lower than 100° C. were blended in the blending ratio shown in Table 1 to prepare a coating liquid comprising a thermoelectric semiconductor composition.

(3) Production of Thermoelectric Conversion Material

Figure 1:
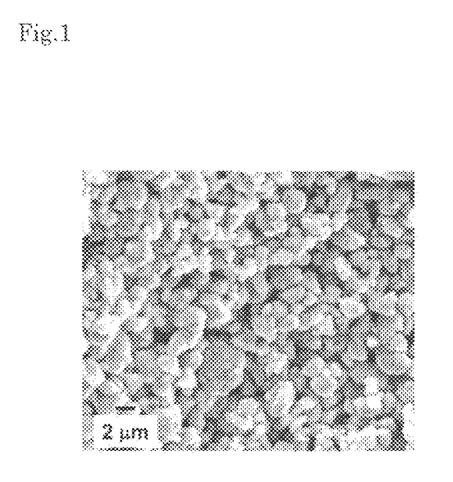
FIG. 1 is a SEM photograph (measurement magnification, 3000 times) of a plane surface of the thin film of the thermoelectric conversion material obtained in Example 1 of the present invention.

The coating liquid prepared in (2) was applied onto a glass substrate of a support, according to a spin coating method, and then dried in an argon atmosphere at a temperature of 110° C. for 10 minutes to give a thin film having a thickness of 10 μm, thereby producing a thermoelectric conversion material. FIG. 1 is a SEM photograph of a plane surface of the thin film of the thermoelectric conversion composition obtained in Example 1.

Example 2

The thermoelectric semiconductor fine particles (T1) were annealed twice in total under the same condition as in (1) to give p-type bismuth telluride fine particles (S2). The mean particle size of the annealed thermoelectric semiconductor fine particle (S2) was 5 μm. A thermoelectric conversion material was produced in the same manner as in Example 1 except that the annealed thermoelectric semiconductor fine particles (S2) were used in place of S1.

Example 3

The fine particles of bismuth selenide-based thermoelectric semiconductor material $Bi_2Se_3$ (T5: particle size 0.88 μm) were annealed in a hydrogen-argon mixed gas atmosphere at a temperature of 300° C. for 1 hour to give fine particles of bismuth selenide-based thermoelectric semiconductor material (S3). The mean particle size of the annealed fine particle (S3) was 1.2 μm. A thermoelectric conversion material was produced in the same manner as in Example 1 except that the fine particles of bismuth selenide-based thermoelectric semiconductor material (S3) were used.

Example 4

The thermoelectric semiconductor fine particles (T5) were annealed twice in total under the same condition as in Example 3 to give fine particles of bismuth selenide-based thermoelectric semiconductor material (S4). The mean particle size of the fine particles (S4) was 3 μm. A thermoelectric conversion material was produced in the same manner as in Example 3 except that the annealed thermoelectric semiconductor fine particles (S4) were used.

Example 5

Figure 2:
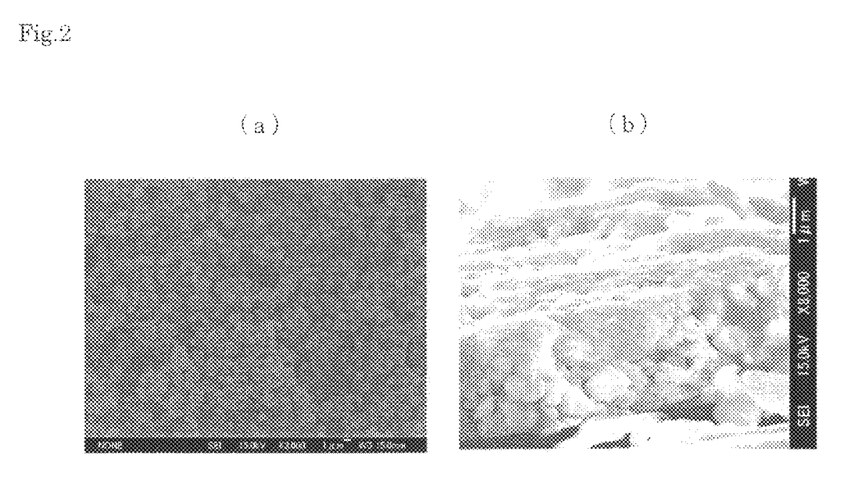
FIG. 2 shows the thin film of the thermoelectric conversion material obtained in Example 5 of the present invention, in which (a) is a SEM photograph (measurement magnification, 3000 times) of a plane surface of the thin film, and (b) is a SEM photograph (measurement magnification, 8000 times) of a cross section of the thin film.

A thermoelectric conversion material was produced in the same manner as in Example 1 except that T1 was used as it was without annealing the thermoelectric semiconductor fine particles (T1). FIG. 2 shows the thin film of the thermoelectric semiconductor composition obtained in Example 5, in which (a) is a SEM photograph of a plane surface thereof, and (b) is a SEM photograph of a cross section thereof.

Example 6

A thermoelectric conversion material was produced in the same manner as in Example 5, except that the blending amount of the thermoelectric semiconductor fine particles was changed to 80% by mass, and the blending ratio of PEDOT:PSS, glycerin and acrylic acid polymer was changed as in Table 1.

Example 7

A thermoelectric conversion material was produced in the same manner as in Example 5 except that the thermoelectric semiconductor fine particles were changed from T1 to T2.

Example 8

A thermoelectric conversion material was produced in the same manner as in Example 7, except that the blending amount of the thermoelectric semiconductor fine particles was changed to 80% by mass, and the blending ratio of PEDOT:PSS, glycerin and acrylic acid polymer was changed as in Table 1.

Example 9

A thermoelectric conversion material was produced in the same manner as in Example 5 except that the thermoelectric semiconductor fine particles were changed from T1 to T3.

Example 10

A thermoelectric conversion material was produced in the same manner as in Example 9, except that the blending amount of the thermoelectric semiconductor fine particles was changed to 80% by mass, and the blending ratio of PEDOT:PSS, glycerin and acrylic acid polymer was changed as in Table 1.

Example 11

A thermoelectric conversion material was produced in the same manner as in Example 5 except that the blending amount of PEDOT:PSS was changed as in Table 1 and glycerin and acrylic acid polymer were not incorporated.

Example 12

A thermoelectric conversion material was produced in the same manner as in Example 11, except that the blending amount of the thermoelectric semiconductor fine particles was changed to 80% by mass, and the blending amount of PEDOT:PSS was changed as in Table 1.

Example 13

A thermoelectric conversion material was produced in the same manner as in Example 11, except that the blending amount of the thermoelectric semiconductor fine particles was changed to 60% by mass, and the blending amount of PEDOT:PSS was changed as in Table 1.

Example 14

A thermoelectric conversion material was produced in the same manner as in Example 11, except that the blending amount of the thermoelectric semiconductor fine particles was changed to 40% by mass, and the blending amount of PEDOT:PSS was changed as in Table 1.

Example 15

A thermoelectric conversion material was produced in the same manner as in Example 11 except that the thermoelectric semiconductor fine particles were changed from T1 to T2.

Example 16

A thermoelectric conversion material was produced in the same manner as in Example 15, except that the blending amount of the thermoelectric semiconductor fine particles was changed to 80% by mass, and the blending amount of PEDOT:PSS was changed as in Table 1.

Example 17

A thermoelectric conversion material was produced in the same manner as in Example 11 except that the thermoelectric semiconductor fine particles were changed from T1 to T3.

Example 18

A thermoelectric conversion material was produced in the same manner as in Example 17, except that the blending amount of the thermoelectric semiconductor fine particles was changed to 80% by mass, and the blending amount of PEDOT:PSS was changed as in Table 1.

Example 19

A thermoelectric conversion material was produced in the same manner as in Example 5 except that the thermoelectric semiconductor fine particles were changed from T1 to T4.

Example 20

A thermoelectric conversion material was produced in the same manner as in Example 5 except that the thermoelectric semiconductor particles were changed from T1 to the fine particles of bismuth selenide-based thermoelectric semiconductor material T6.

Comparative Example 1

A thin film having a thickness of 100 nm was formed in the same manner as in Example 1 but using, as the thermoelectric semiconductor composition, only the conductive polymer PEDOT:PSS, thereby producing a thermoelectric conversion material.

Comparative Example 2

A coating liquid comprising a thermoelectric semiconductor composition was prepared, in which the blending amount of PEDOT:PSS, glycerin and acrylic acid polymer was as in Table 1. Using the coating liquid and in the same manner as in Example 1, a thin film having a thickness of 5000 nm was formed, thereby producing a thermoelectric conversion material.

The thermoelectric performance evaluation results of the thermoelectric conversion materials obtained in Examples 1 to 20 and Comparative Examples 1 and 2 are shown in Table 1.

TABLE 1

| | Thermoelectric Semiconductor Fine Particles | | | | Other Components | | | | | | |
| --- | --- | --- | --- | --- | --- | --- | --- | --- | --- | --- | --- |
| | Blending Amount of P-type Bismuth Telluride (% by mass) | Blending Amount of N-type Bismuth Selenide (% by mass) | Annealing Treatment (yes or no/ frequency) | Mean Particle Size (nm) | Conductive Polymer PEDOT:PSS (% by mass) | Glycerin (% by mass) | Acrylic Acid Polymer (% by mass) | Thickness (nm) | Electrical Conductivity (S/cm) | Seebeck Coefficient (μV/K) | Thermal Conductivity (W/(mK)) | ZT (T: 300 K) |
| Example 1 | 90 | — | (yes/1) | 2400 (S1) | 2 | 4 | 4 | 10000 | 350 | 88 | 0.32 | 0.2541 |
| Example 2 | 90 | — | (yes/2) | 5000 (S2) | 2 | 4 | 4 | 10000 | 300 | 120 | 0.41 | 0.3161 |
| Example 3 | — | 90 | (yes/1) | 1200 (S3) | 2 | 4 | 4 | 10000 | 120 | −30 | 0.27 | 0.0120 |
| Example 4 | — | 90 | (yes/2) | 3000 (S4) | 2 | 4 | 4 | 10000 | 140 | −100 | 0.35 | 0.1200 |
| Example 5 | 90 | — | (no/0) | 660 (T1) | 2 | 4 | 4 | 5000 | 200 | 29 | 0.24 | 0.0210 |
| Example 6 | 80 | — | (no/0) | 660 (T1) | 4 | 8 | 8 | 5000 | 350 | 20 | 0.24 | 0.0175 |
| Example 7 | 90 | — | (no/0) | 2800 (T2) | 2 | 4 | 4 | 4000 | 350 | 73 | 0.36 | 0.1554 |
| Example 8 | 80 | — | (no/0) | 2800 (T2) | 4 | 8 | 8 | 4000 | 380 | 66 | 0.36 | 0.1379 |
| Example 9 | 90 | — | (no/0) | 5500 (T3) | 2 | 4 | 4 | 4600 | 270 | 63 | 0.55 | 0.0585 |
| Example 10 | 80 | — | (no/0) | 5500 (T3) | 4 | 8 | 8 | 4600 | 350 | 53 | 0.55 | 0.0536 |
| Example 11 | 90 | — | (no/0) | 660 (T1) | 10 | — | — | 200 | 400 | 18 | 0.24 | 0.0162 |

TABLE 1-continued

| | Thermoelectric Semiconductor Fine Particles | | | | Other Components | | | | | | | |
|---|---|---|---|---|---|---|---|---|---|---|---|---|
| | Blending Amount of P-type Bismuth Telluride (% by mass) | Blending Amount of N-type Bismuth Selenide (% by mass) | Annealing Treatment (yes or no/ frequency) | Mean Particle Size (nm) | Conductive Polymer PEDOT:PSS (% by mass) | Glycerin (% by mass) | Acrylic Acid Polymer (% by mass) | Thickness (nm) | Electrical Conductivity (S/cm) | Seebeck Coefficient (μV/K) | Thermal Conductivity (W/(mK)) | ZT (T: 300 K) |
| Example 12 | 80 | — | (no/0) | 660 (T1) | 20 | — | — | 200 | 420 | 16 | 0.24 | 0.0134 |
| Example 13 | 60 | — | (no/0) | 660 (T1) | 40 | — | — | 200 | 435 | 15 | 0.24 | 0.0122 |
| Example 14 | 40 | — | (no/0) | 660 (T1) | 60 | — | — | 200 | 500 | 12 | 0.24 | 0.0090 |
| Example 15 | 90 | — | (no/0) | 2800 (T2) | 10 | — | — | 200 | 400 | 30 | 0.36 | 0.0300 |
| Example 16 | 80 | — | (no/0) | 2800 (T2) | 20 | — | — | 200 | 412 | 27 | 0.36 | 0.0250 |
| Example 17 | 90 | — | (no/0) | 5500 (T3) | 10 | — | — | 200 | 400 | 40 | 0.55 | 0.0349 |
| Example 18 | 80 | — | (no/0) | 5500 (T3) | 20 | — | — | 200 | 410 | 35 | 0.55 | 0.0274 |
| Example 19 | 90 | — | (no/0) | 180000 (T4) | 2 | 4 | 4 | 5000 | 50 | 100 | 2 | 0.0075 |
| Example 20 | — | 90 | (no/0) | 20000 (T6) | 2 | 4 | 4 | 5000 | 405 | −60 | 1.2 | 0.0365 |
| Comparative Example 1 | — | — | (no/0) | — | 100 | — | — | 100 | 500 | 5 | 0.23 | 0.0016 |
| Comparative Example 2 | — | — | (no/0) | — | 20 | 40 | 40 | 5000 | 650 | 8 | 0.24 | 0.0052 |

The thermoelectric conversion materials of Examples 1 to 20 containing thermoelectric semiconductor fine particles and a conductive polymer were excellent in the non-dimensional figure of merit ZT, as compared with the material of Comparative Example 1 comprising a conductive polymer alone. In particular, as known from Examples 1 to 4, the thermoelectric conversion materials using annealed thermoelectric semiconductor fine particles exhibited a more excellent non-dimensional figure of merit ZT.

Example 21

A thermoelectric conversion material was produced in the same manner as in Example 5, except that the support was changed from the glass substrate to a polyethylene terephthalate film (Toyobo's trade name: Cosmoshine PET 100A4100, hereinafter referred to as PET substrate).

Example 22

A thermoelectric conversion material was produced in the same manner as in Example 7, except that the support was changed from the glass substrate to the PET substrate.

Example 23

A thermoelectric conversion material was produced in the same manner as in Example 9, except that the support was changed to the PET substrate.

Comparative Example 3

As a thermoelectric semiconductor composition, thermoelectric semiconductor fine particles (T1) alone were dispersed in an ethanol solvent, and sprayed onto a PET substrate according to a spray coating method, and dried in an argon atmosphere at a temperature of 110° C. for 10 minutes to form a thin film (pellet-like thermoelectric semiconductor composition) having a thickness of 1000 nm.

The flexibility evaluation results of the thermoelectric conversion materials obtained in Examples 21 to 23 and Comparative Example 3 are shown in Table 2.

Of the thermoelectric conversion materials of Examples 21 to 23 containing thermoelectric semiconductor fine particles and a conductive polymer, the non-dimensional figure of merit ZT did not almost lower before and after the cylindrical mandrel test, and the materials were known to be excellent in flexibility.

On the other hand, the thermoelectric conversion material of Comparative Example 3 comprising thermoelectric semiconductor fine particles alone was poorly flexible and the thin film thereof could not keep the shape after the cylindrical mandrel test and therefore could not function as a thermoelectric conversion material.

TABLE 2

| | before cylindrical mandrel test | | | | after cylindrical mandrel test | | | |
|---|---|---|---|---|---|---|---|---|
| | Electrical Conductivity (S/cm) | Seebeck Coefficient (μV/K) | Thermal Conductivity (W/(mK)) | ZT (T: 300 K) | Electrical Conductivity (S/cm) | Seebeck Coefficient (μV/K) | Thermal Conductivity (W/(mK)) | ZT (T: 300 K) |
| Example 21 | 200 | 29 | 0.24 | 0.0210 | 196 | 28 | 0.24 | 0.0192 |
| Example 22 | 350 | 73 | 0.36 | 0.1554 | 330 | 74 | 0.36 | 0.1506 |
| Example 23 | 270 | 63 | 0.55 | 0.0585 | 267 | 63 | 0.55 | 0.0578 |
| Comparative Example 3 | 0.2 | 200 | 2 | 0.0001 | 0.02 | — | 2 | — |

INDUSTRIAL APPLICABILITY

The thermoelectric conversion material of the present invention is formed into a thermoelectric conversion element that carries out energy interconversion between heat and electricity, and is set in a module and put into practical use. Concretely, the present invention provides a thermoelectric conversion material capable of being produced in a simplified manner and at a low cost and excellent in thermoelectric performance, which can be used as a low-cost thermoelectric conversion material for large-area applications for, for example, installation on wall surfaces of buildings, etc.

The invention claimed is:

1. A thermoelectric conversion material, comprising:
   a support; and
   a thin film formed by drying a thermoelectric semiconductor composition which comprises thermoelectric semiconductor fine particles and a conductive polymer,
   wherein the thin film is formed on the support, and
   the thermoelectric semiconductor fine particles are annealed particles.

2. The thermoelectric conversion material according to claim 1, wherein an amount of the thermoelectric semiconductor fine particles in the thermoelectric semiconductor composition is from 30 to 99% by mass.

3. The thermoelectric conversion material according to claim 1, wherein the thermoelectric semiconductor fine particles have a mean particle size of from 10 nm to 200 μm.

4. The thermoelectric conversion material according to claim 1, wherein the thermoelectric semiconductor fine particles are bismuth-tellurium-based thermoelectric semiconductor fine particles.

5. The thermoelectric conversion material according to claim 1, wherein the conductive polymer is a polythiophene or a derivative thereof.

6. The thermoelectric conversion material according to claim 1, wherein the thermoelectric semiconductor composition further comprises a water-soluble polymer.

7. The thermoelectric conversion material according to claim 6, wherein the water-soluble polymer is a water-soluble polyvinyl polymer.

8. The thermoelectric conversion material according to claim 1, wherein the thermoelectric semiconductor composition further comprises an organic compound having a boiling point of 100° C. or higher,
   wherein the organic compound is at least one compound selected from the group consisting of glycerin, sorbitol, maltitol, diglycerin, ethylene glycol, diethylene glycol, propylene glycol, dipropylene glycol, 1,3-butanediol, 1,4-butanediol, erythritol, sorbitan, glucose, polyethylene glycol, 1,2-butylene glycol, 1,3-butylene glycol, 2,3-butylene glycol, 3-methyl-1,3-butylene glycol, tetramethylene glycol, 1,2-pentanediol, 1,2-hexanediol, trimethylolpropane, pentaerythritol, xylitol, trehalose, mannitol, N-methylpyrrolidone, N-ethylpyrrolidone, N-propylpyrrolidone, N-isopropylpyrrolidone, N-butylpyrrolidone, N-t-butylpyrrolidone, N-pentylpyrrolidone, N-hexylpyrrolidone, N-heptylpyrrolidone, N- cyclohexylpyrrolidone, N-octylpyrrolidone, N-(2-ethylhexyl pyrrolidone, N-phenylpyrrolidone, N-benzylpyrrolidone, phenethylpyrrolidone, 2-methoxyethylpyrrolidone, 2-methoxypropylpyrrolidone, 2-hydroxypropylpyrrolidone, vinylpyrrolidone, 2-pyrrolidone, dimethyl sulfoxide, and N,N-dimethylformamide.

9. The thermoelectric conversion material according to claim 8, wherein the organic compound is at least one compound selected from the group consisting of glycerin, sorbitol, maltitol, diglycerin, ethylene glycol, diethylene glycol, propylene glycol, dipropylene glycol, 1,3-butanediol, 1,4-butanediol, erythritol, sorbitan, glucose, polyethylene glycol, 1,2-butylene glycol, 1,3-butylene glycol, 2,3-butylene glycol, 3-methyl-1,3-butylene glycol, tetramethylene glycol, 1,2-pentanediol, 1,2-hexanediol, trimethylolpropane, pentaerythritol, xylitol, trehalose, and mannitol.

10. The thermoelectric conversion material according to claim 1, wherein an amount of the conductive polymer in the thermoelectric semiconductor composition is from 1 to 70% by mass.

11. The thermoelectric conversion material according to claim 1, further comprising:
   at least one additive selected from the group consisting of a dispersant, a film formation assistant, a light stabilizer, an antioxidant, a tackifier, a plasticizer, a colorant, a resin stabilizer, a filler, a pigment, and a conductive promoter.

12. The thermoelectric conversion material according to claim 1, wherein the annealed particles are annealed at a temperature not higher than the melting point of the thermoelectric semiconductor fine particles.

13. The thermoelectric conversion material according to claim 1, wherein the thermoelectric semiconductor fine particles has a mean particle size of from 10 nm to 30 μm.

14. The thermoelectric conversion material according to claim 1, wherein the thermoelectric semiconductor fine particles have a mean particle size of from 50 nm to 5 μm.

15. A method for producing a thermoelectric conversion material, the method comprising:
   applying a thermoelectric semiconductor composition comprising thermoelectric semiconductor fine particles and a conductive polymer onto a support; and
   drying the thermoelectric semiconductor composition such that a thin film is formed on the support,
   wherein the thermoelectric semiconductor fine particles are annealed particles.

16. The method according to claim 15, wherein the annealed particles are annealed at a temperature not higher than the melting point of the thermoelectric semiconductor fine particles.

17. The method according to claim 15, wherein an amount of the thermoelectric semiconductor fine particles in the thermoelectric semiconductor composition is from 30 to 99% by mass.

18. The method according to claim 15, wherein an amount of the thermoelectric semiconductor fine particles in the thermoelectric semiconductor composition is from 50 to 96% by mass.

19. The method according to claim 15, wherein an amount of the conductive polymer in the thermoelectric semiconductor composition is from 1 to 70% by mass.

20. The method according to claim 15, wherein an amount of the conductive polymer in the thermoelectric semiconductor composition is from 4 to 50% by mass.

* * * * *